United States Patent
Benedix et al.

(10) Patent No.: US 7,305,525 B2
(45) Date of Patent: Dec. 4, 2007

(54) MEMORY SYSTEM FOR NETWORK BROADCASTING APPLICATIONS AND METHOD FOR OPERATING THE SAME

(75) Inventors: Alexander Benedix, München (DE); Stefan Dankowski, Haar-Ottendichl (DE); Reinhard Düregger, Poing (DE); Wolfgang Ruf, Friedberg (DE)

(73) Assignee: Infineon Technologies, AG, Neubiberg (DE)

( * ) Notice: Subject to any disclaimer, the term of this patent is extended or adjusted under 35 U.S.C. 154(b) by 378 days.

(21) Appl. No.: 11/132,419

(22) Filed: May 19, 2005

(65) Prior Publication Data

US 2005/0248994 A1 Nov. 10, 2005

Related U.S. Application Data

(63) Continuation of application No. PCT/DE03/03576, filed on Oct. 28, 2003.

(30) Foreign Application Priority Data

Nov. 19, 2002 (DE) .............................. 102 53 918

(51) Int. Cl.
*G06F 12/00* (2006.01)
*G11C 5/00* (2006.01)

(52) U.S. Cl. ................ 711/146; 711/100; 711/154; 365/189.05

(58) Field of Classification Search ................ 711/100, 711/105, 146, 154, 200, 189.05
See application file for complete search history.

(56) References Cited

U.S. PATENT DOCUMENTS 4,148,073 A * 4/1979 Slobodzian et al. ........ 348/798
4,794,566 A 12/1988 Richards et al.
4,866,431 A * 9/1989 Andros et al. ......... 340/825.02
4,890,281 A * 12/1989 Balboni et al. ............. 370/415
5,612,790 A 3/1997 Sakamoto et al.
5,671,386 A 9/1997 Blair et al.
5,721,815 A * 2/1998 Ottesen et al. .............. 715/721
5,751,883 A * 5/1998 Ottesen et al. ................ 386/27
5,757,415 A 5/1998 Asamizuya et al.
5,799,209 A 8/1998 Chatter
6,185,621 B1 2/2001 Romine
6,233,735 B1 5/2001 Ebihara

OTHER PUBLICATIONS

Christopher Pleier "Festplatten auf Halbleiterbasis", Solid State Disks, Nov. 1997.

* cited by examiner

*Primary Examiner*—Tuan V. Thai
(74) *Attorney, Agent, or Firm*—Edell, Shapiro & Finnan, LLC

(57) ABSTRACT

A memory system for network broadcasting applications, such as video/audio applications, has at least one memory which is divided into a plurality of addressable memory units, which have a respective dedicated output for interchanging data. The inputs of a matrix switch are connected to a respective output of a different memory unit. The matrix switch is operated such that a plurality of the memory units are connected to its output in a sequential order. A first sequence of memory units and a second sequence of memory units are connected to its output independently. This results in a memory system, which can handle a number of requests to the same memory at staggered times. The interaction of the individual memory units with the matrix switch allows a high data throughput and a short access time.

14 Claims, 2 Drawing Sheets

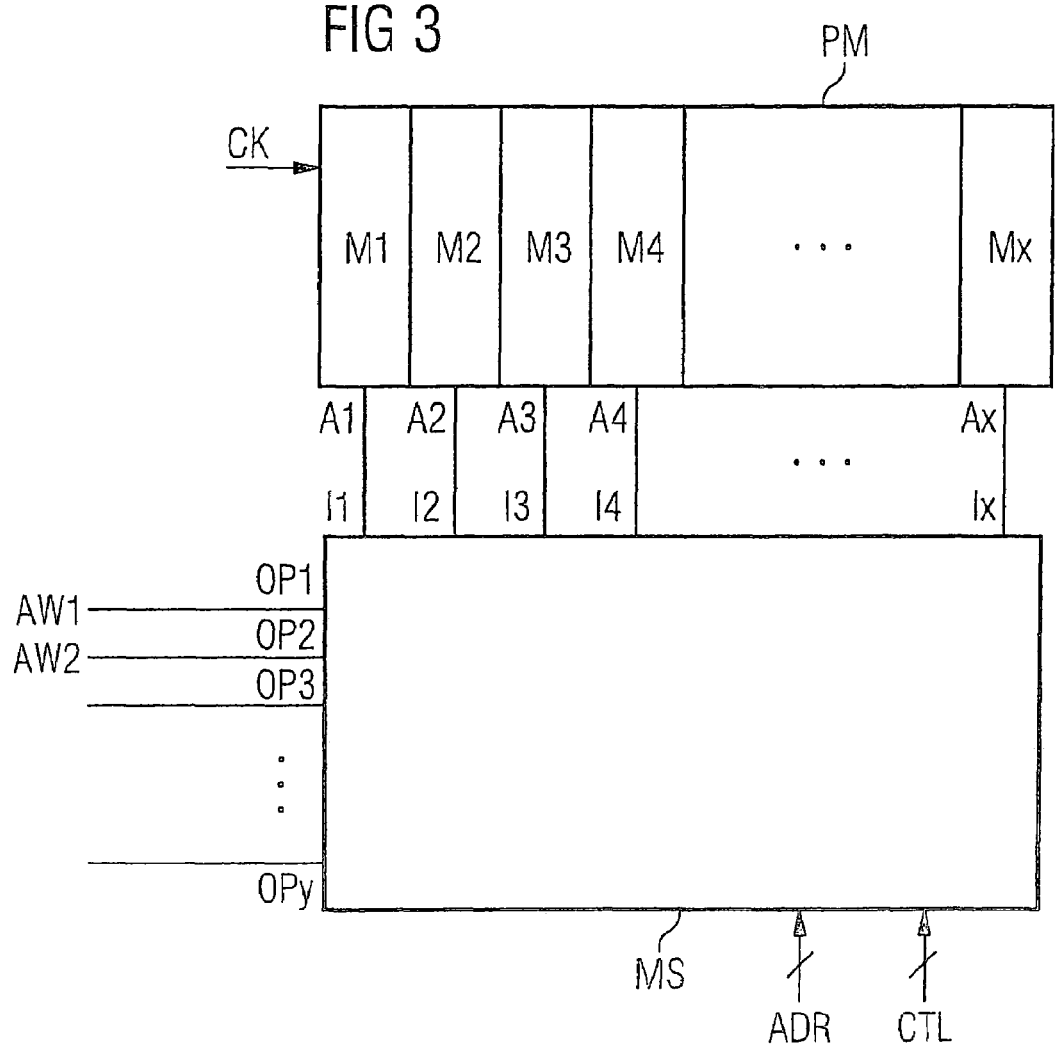
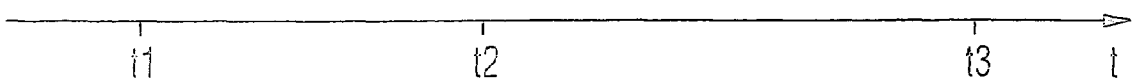

MEMORY SYSTEM FOR NETWORK BROADCASTING APPLICATIONS AND METHOD FOR OPERATING THE SAME

CROSS REFERENCE TO RELATED APPLICATIONS

This application is a continuation of PCT/DE03/03576, filed Oct. 28, 2003, and titled "Memory System, In Particular for Network Broadcasting Applications Such as Video/Audio Applications, and Method for Operating a Memory System," which claims priority to German Application No. DE 102 53 918.9, filed on Nov. 19, 2003, and titled "Memory System, Particularly for Network Broadcasting Applications Such as Video/Audio Applications, and Method for Operating a Memory System," the entire contents of each are hereby incorporated by reference.

FIELD OF THE INVENTION

The invention relates to a memory system for network broadcasting applications, such as video/audio applications and to a method for operating the same.

BACKGROUND

In the field of network broadcasting applications, memory systems are used in which data records, such as video films or pieces of music, are stored in respective memories. In this context, it has been usual to date to equip a memory system with a comparatively large number of hard disk memories ("hard disk clusters"), which can store a large volume of data at comparatively low costs. A plurality of users can, particularly, using a network connection, retrieve various data records or the same data record, to which end the appropriate hard disk memory is addressed. A particular feature of network broadcasting applications in this context is that an identical data record, for example in the form of a video film or piece of music, is retrieved in a firmly prescribed order ("video-audio on demand"). There is thus no random access to the memory system.

A drawback of such memory systems, which use a large number of hard disk memories for storing such data records, is that hard disk memories have a comparatively low data throughput and are limited in data access time. For example, when there are simultaneous requests from a plurality of users retrieving the same video film or the same piece of music at staggered times, for example, the hard disk memory, which has stored the data record in question, repeatedly needs to skip to various memory locations in order to provide the individual users sequentially with the data records requested at staggered times. This results, in particular, in such a memory system being greatly limited in the data throughput and in the data access time.

A memory system for network broadcasting applications, such as video/audio applications, which allows a higher data throughput and shorter access times, and a method for operating the same.

SUMMARY

A memory which is divided into a plurality of addressable memory units, which each have a dedicated output for interchanging data, and a matrix switch ("multiswitch") with inputs, at least one output, and a control input. The matrix switch is designed such that each input can be connected to its output. The inputs of the matrix switch are connected to a respective output of a different memory unit. At least one control unit of the matrix switch is used to set which of its inputs is connected to its output. The matrix switch is operated such that a plurality of the memory units are connected to its output in a sequential order, with a first sequence of memory units and a second sequence of memory units being connected to its output independently. This results in a memory system, particularly, for example, for the requirements of network broadcasting applications, such as video/audio applications, which can handle a number of requests for the same memory at staggered times, with the interaction of the individual memory units with the matrix switch allowing a high data throughput and a short access time. In this context, for example, the memory is in the form of a volatile or nonvolatile SRAM, DRAM, MRAM, or Flash memory.

The individual memory units of the memory store respective data records which, together, form a cohesive data record for an application, for example, a video/audio application. For example, the memory stores a video film, with individual memory units each storing film sequences of a particular length, which, together, produce a cohesive video film. This makes it possible to start a data sequence at discrete intervals, namely, by addressing the memory unit in question. In contrast to the memory systems used previously, which offer purely random or purely sequential access (for example, hard disk memory system, as described above, or video cassette), the memory system based on the invention affords a mixture of the two variants, which takes account of the application requirements of today. Through a certain restriction in the random access through discretization into individual memory units and through the use of a matrix switch, there is no longer restriction as a result of the data rate of the storage medium, but rather, there is, in principle, a restriction through the number of outputs of the matrix switch, which can be increased with comparatively little complexity, however.

During operation of the inventive memory system, a data record is stored in each of the memory units. A respective different memory unit from the memory units is addressed in respective sequential order, and the data records in question are applied to the output in question in a respective sequence via the matrix switch. For example, one of the memory units is addressed for each outgoing sequence, and then, for each sequence to be output, starting at the addressed memory unit, a respective complete data record from this and from subsequently sequentially addressed memory units is applied to the output of the matrix switch. In this context, for example, if the data stored in the respective memory unit are applied sequentially to the output of the memory unit in question.

In one embodiment, the memory system has a plurality of memories whose performance differs, for example, in different data access times. For example, the memory based on the invention is in the form of a comparatively fast memory, for example, an SRAM, a DRAM, an MRAM, or a Flash memory. The memory system has at least one further memory, which has a data access time which is slower than the data access time of the fast memory. For example, the further memory is in the form of a hard disk memory, which is comparatively inexpensive and can store a relatively large volume of data.

A memory system of such a design can be optimized for network broadcasting applications. For example, the fast memory stores a data record for comparatively up-to-date application, for example, a current video film. By contrast, the slower hard disk memory stores a data record for an earlier application, for example, an earlier video film, which has an earlier date of origin than the first application, which is stored in the fast memory. Such action is based on the insight that an earlier application, particularly, an earlier video film, is requested relatively comparatively rarely, and even more rarely by a plurality of users simultaneously. For this, a memory system, which has "hard disk clusters" for storing such data records, as previously, is suitable. By contrast, comparatively up-to-date applications such as recent video films are requested more frequently and very often simultaneously. These demands on an increased data rate are met by the inventive memory system, as presented above.

BRIEF DESCRIPTION OF THE DRAWINGS

The invention is explained in more detail below with reference to the figures which are illustrated in the drawing, in which:

FIG. 3 shows a further embodiment of a memory system based on the invention, and FIG. 4 shows a sequence diagram for a plurality of users' data access to a memory system based on the invention.

DETAILED DESCRIPTION

Figure 1:
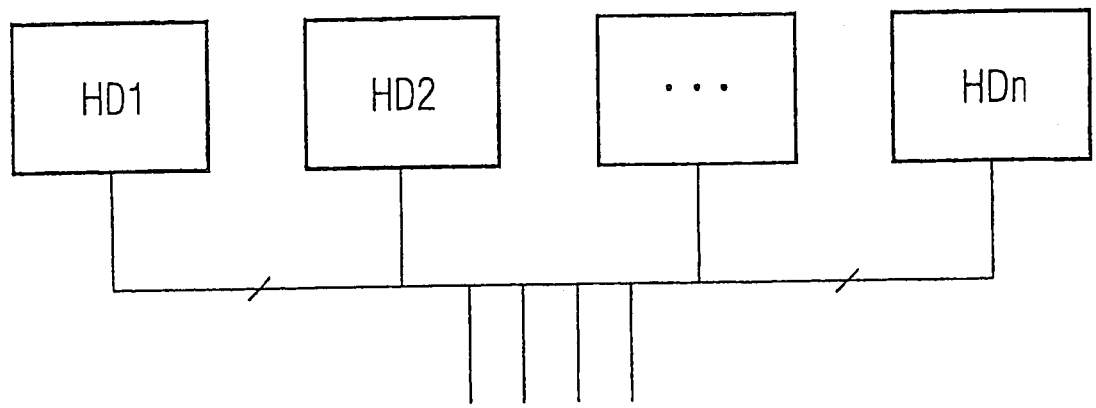
FIG. 1 shows a memory system particularly for network broadcasting applications based on the prior art.

FIG. 1 shows a memory system based on the prior art constructed from "hard disk clusters". Such a memory system is used, in particular, for network broadcasting applications, such as video/audio applications, in which a data record, for example, a video film or a piece of music, can be requested by different users. To this end, a memory system having a plurality of hard disk memories HD1 to HDn has been used to date, which can store a large volume of data at low costs. A plurality of users can retrieve various data records or the same data record at staggered times. However, such memory systems having a plurality of hard disk clusters are limited by a relatively low data throughput and by a comparatively slow access time, as described at the outset.

Figure 2:
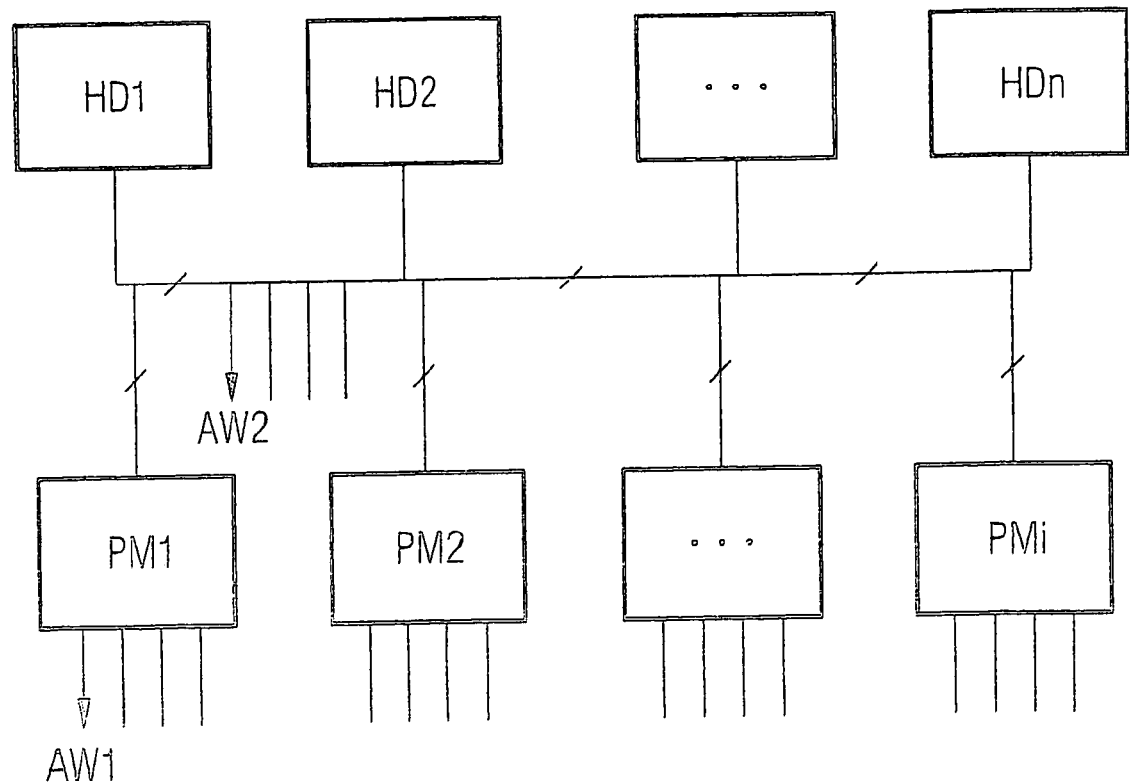
FIG. 2 shows an embodiment of a memory system based on the invention.

FIG. 2 shows an embodiment of a memory system based on the invention which has an array including a plurality of hard disk memories HD1 to HDn and an array including faster memories PM1 to PMi (the design and manner of operation will be explained in more detail with reference to FIGS. 3 and 4). Both the hard disk memories HD1 to HDn and the faster memories PM1 to PMi can be connected to different users, such as AW1 and AW2, via respective data lines.

FIG. 3 shows an embodiment of a memory system based on the invention, with a form and interconnection of one of the memories PM1 to PMi shown in FIG. 2 being shown in more detail using FIG. 3. The memory system based on FIG. 3 has a memory PM divided into a plurality of addressable memory units M1 to Mx. Each has a dedicated output A1 to Ax for interchanging data. A matrix switch MS ("multi-switch") has inputs I1 to Ix, outputs OP1 to OPy, and a control input CTL. The inputs I1 to Ix of the matrix switch MS are connected to a respective output A1 to Ax of a different memory unit M1 to Mx.

The memory units M1 to Mx store respective data records, which, form a cohesive data record for an application, for example, a video/audio application. For example, each memory unit M1 to Mx stores a portion of a video film, for example, a respective data record producing five seconds of a video film, for example. To form a film of 120 minutes in length, for example, the present exemplary embodiment requires 1440 memory units M1 to Mx which have a respective output connected to the matrix switch MS.

The control input CTL of the matrix switch MS can set which input I1 to Ix is connected to one of its outputs OP1 to OPy. The number is determined by the number of users in the present example. In this case, the matrix switch MS is operated such that a plurality of the memory units M1 to Mx are connected to the appropriate output OP1 to OPy in a sequential order, with a first sequence of memory units and a second sequence of memory units are connected to the outputs independently. In the present exemplary embodiment, i.e., the users AW1 and AW2, which are connected to the outputs OP1 and OP2, are connected to different sequences of memory units independently of one another. In other words, there are two different users AW1 and AW2 connected to the matrix switch MS which access the memory independently.

In connection with FIG. 4, which shows a sequence diagram for data access by a plurality of users, the text below gives a more detailed description of the operation of the inventive memory system shown in FIG. 3.

At time t1, a user #1 accesses the memory PM shown in FIG. 3 using the start address ADR#0. The user #1, which is connected to the output OP1, for example, is connected to the memory unit M1 via the matrix switch MS. The memory unit M1 stores the start of a video film. Next, the subsequent memory units M2 to Mx are addressed in sequential order and the data records in question are applied to the output OP1 in a respective sequence via the matrix switch MS. In this context, starting at the addressed memory unit M1, a respective complete data record from this and from the subsequently sequentially addressed memory units M2 to Mx is applied to the output OP1 of the matrix switch MS. In this case, the data stored in the respective memory unit M1 to Mx are applied sequentially to the output A1 to Ax of the memory unit in question using the clock signal CK.

At time t2, a user #2 accesses the data record with the address ADR#7E, which is stored in the memory unit M2. This connects the input I2 of the matrix switch MS to the output OP2, for example, to which the user #2 is connected. In similar fashion to the user #1, the matrix switch MS is operated for the user #2 such that the memory units M2 to Mx are connected to the output OP2 in a sequential order. In this context, the sequence for the user #1 is independent of the sequence for the user #2.

At time t3, a user #3, which is connected to the output OP3, for example, accesses the data record with the address ADR#3FFFC, so that the input Ix-2 of the matrix switch MS is connected to the output OP3, for example. This access sequence also takes place independently of the access for the users #1 and #2.

The matrix switch MS can thus be used, in principle, by any user to select one of the memory units M1 to Mx from which it wishes to obtain the data. Every five seconds, the address is automatically increased, which means that the subsequent memory unit is connected to the relevant output OP1 to OPy. As a result, the data records from the individual memory units M1 to Mx are joined seamlessly together to form an application, for example, a video film. In this context, it is possible to interrupt the sequential order of the requested data records at any time and to continue to output a data record from each of the memory units. Hence, by manually skipping forward or back, it is possible to "fast forward and rewind" the film. Since the memory units M1 to Mx simultaneously apply their data records to the switch MS sequentially, it is, in principle, possible for any number of users to access the memory PM almost randomly (in the present example, in the 5-second frame). The number of users is limited by the number of available outputs OP1 to OPy of the matrix switch MS. The granularity of the video film is determined by the number of memory units, and the maximum length of the film is determined by the scope of the memory. To minimize the number of outputs of the matrix switch MS, it is possible to use a "multiplexing system," for example, so that a plurality of users have access via just one output. To be able to match different applications flexibly, the size of the memory units is dynamically adjustable in one exemplary embodiment.

With the embodiment of a memory system of FIG. 2, a memory system for network broadcasting applications optimized in terms of data access time and provision costs. For example with reference to the storage of video films, the hard disk memories HD1 to HDn are suitable for storing earlier/less popular films in large numbers (large volume of data), these generally being requested only very rarely, and even more rarely at the same time, however (low data rate). Video films which are in contrast more popular/more up-to-date are stored in the fast memories PM1 to PMi, which are in the form of SRAMs, DRAMs, MRAMs or Flash memories, for example. The memories PM1 to PMi have a faster data access time than the hard disk memories HD1 to HDn. This design takes account of the fact that more popular/more up-to-date films are requested relatively frequently and very often simultaneously (small volume of data, high data rate).

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

| List of reference symbols | |
|---|---|
| HD1 to HDn | Hard disk memory |
| PM, PM1 to PMi | Memory |
| MS | Matrix switch |
| A1 to Ax | Output |
| I1 to Ix | Input |
| OP1 to OPy | Output |
| AW1, AW2 | User |
| ADR | Address |
| CTL | Control input |
| M1 to Mx | Memory unit |
| CK | Clock signal |
| t, t1, t2, t3 | Time |

What is claimed is:

1. A memory system for network broadcasting applications, comprising:
    at least one memory divided into a plurality of addressable memory units each including a dedicated output for interchanging data; and
    a matrix switch including inputs, at least one output, and at least one control input, the inputs of the matrix switch being connectable to the at least one output of the matrix switch, wherein:
    the inputs of the matrix switch are connected to a respective output of a different memory unit;
    the control input of the matrix switch sets which of the inputs of the matrix switch is connected to the output of the matrix switch;
    the plurality of the addressable memory units are connectable to the output of the matrix switch in a sequential order, a first sequence of memory units and a second sequence of memory units being connected to the output of the matrix switch independently; and
    the memory units are capable of continuing to output data records even if the sequential order is interrupted.

2. The memory system as claimed in claim 1, wherein the memory units store respective data records, the memory units together forming a cohesive data record for an application.

3. The memory system of claim 2, wherein the application is a video/audio application.

4. The memory system as claimed in claim 1, wherein the output of the matrix switch has at least two different users connected thereto, the user accessing the memory independently.

5. The memory system as claimed in claim 1, wherein the memory is actuated such that data stored in a respective memory unit are applied sequentially to the output of the memory unit.

6. The memory system as claimed in claim 1, wherein the size of the memory units is adjusted dynamically.

7. The memory system as claimed in claim 1, wherein the memory system has a further memory with a data access time slower than a data access time for the at least one memory, and the memories each being connected to respective users independently.

8. The memory system as claimed in claim 7, wherein the at least one memory is an SRAM, DRAM, MRAM or Flash memory, and the further memory is a hard disk memory.

9. The memory system as claimed in claim 7, wherein the at least one memory stores a data record for a first application, and
    the further memory stores a data record for a second application, with an earlier date of origin than the first application.

10. The memory system as claimed in claim 9, wherein the first application is a video/audio application.

11. The memory system as claimed in claim 9, wherein the second application is a video/audio application.

12. A method for operating a memory system as claimed in claim 1, wherein
    each memory unit stores a data record,
    a respective different memory unit from the memory units is addressed in respective sequential order for at least two sequences to be output, and
    the data records are applied to the output in a respective sequence via the matrix switch.

13. The method as claimed in claim 12, wherein one of the memory units is addressed for each sequence to be output, and
    for each sequence to be output, starting at the addressed memory unit, a respective complete data record from this and from subsequently sequentially addressed memory units is applied to the output of the matrix switch.

14. The method as claimed in claim 12, wherein data stored in a respective memory unit are applied sequentially to the output of the memory unit in question.

* * * * *